(12) United States Patent
Yoshida

(10) Patent No.: US 8,618,963 B2
(45) Date of Patent: Dec. 31, 2013

(54) BIT CONVERTER AND BIT CONVERSION METHOD

(75) Inventor: Kenji Yoshida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/413,470

(22) Filed: Mar. 6, 2012

(65) Prior Publication Data

US 2013/0049997 A1 Feb. 28, 2013

(30) Foreign Application Priority Data

Aug. 29, 2011 (JP) ................................. 2011-186562

(51) Int. Cl.
*H03M 13/00* (2006.01)

(52) U.S. Cl.
USPC .................. 341/94; 341/50; 341/51

(58) Field of Classification Search
USPC .................. 341/94, 50, 51; 714/784, 794
See application file for complete search history.

(56) References Cited

U.S. PATENT DOCUMENTS

| | | | |
|---|---|---|---|
| 2008/0040651 A1* | 2/2008 | Kanaoka et al. | 714/794 |
| 2010/0211857 A1* | 8/2010 | Kobayashi | 714/784 |

FOREIGN PATENT DOCUMENTS

| | | |
|---|---|---|
| JP | 04-372779 | 12/1992 |
| JP | 2000-134114 | 5/2000 |
| JP | 2002-015530 | 1/2002 |
| JP | 2004-335000 | 11/2004 |
| JP | 2005-050415 | 2/2005 |
| JP | 2005-166089 | 6/2005 |
| WO | 2009/011059 | 1/2009 |
| WO | 2010 082946 | 7/2010 |

OTHER PUBLICATIONS

Japanese Office Action dated Oct. 23, 2012 filed in Japanese Counterpart Application No. 2011-186562, 6 pages (with translation).
Japanese Office Action mailed Jan. 29, 2013 by Japanese Patent Office for corresponding Japanese Application No. 2011-186562, 3 pages (with translation).

* cited by examiner

*Primary Examiner* — Jean B Jeanglaude
(74) *Attorney, Agent, or Firm* — Patterson & Sheridan, LLP

(57) ABSTRACT

An embodiment of a bit converter includes a substitution module and an output module. The substitution module substitutes a decision result representing one of "0" and "1" for input bit information based on a substitution rule for bit information for converting a bit string of a predetermined pattern into a predetermined code word. The output module outputs the decision result of the bit information substituted by the substitution module, to a decoder configured to decode the decision result into the predetermined code word.

10 Claims, 6 Drawing Sheets

BIT CONVERTER AND BIT CONVERSION METHOD

CROSS-REFERENCE TO RELATED APPLICATIONS

This application is based upon and claims the benefit of priority from Japanese Patent Application No. 2011-186562, filed on Aug. 29, 2011; the entire contents of which are incorporated herein by reference.

FIELD

Embodiments of the present invention relate to a bit converter and a bit conversion method.

BACKGROUND

Up to now, there is a possibility that an error occurs due to external noise or the like in media for storing and transmitting digital data, for example. For this reason, quality inspections are conducted on the media before being shipped as products.

In HDD recording media, for example, a predetermined pattern for defect scanning is conventionally written into the entire surface to thereby conduct various inspections.

Incidentally, in the case of reading digital data from recording media, an error correction code is used to detect and correct an error occurring in the digital data. In the error correction code, redundant data is added to the data during encoding, and the error of the data is corrected based on the redundant data during decoding.

In the case of detecting and correcting the error using the error correction code, however, a decoding target sequence needs to be code words. When error detection and correction is to be performed on digital data read from recording media, for example, it is necessary to preliminarily write code words in the recording media. If the pattern for defect scanning, which is written for inspection, is not represented by code words, it is necessary to rewrite the entire surface of the recording media. This cases a problem in that the inspection time during shipment of products is increased and the load on the inspection is heavy.

DETAILED DESCRIPTION

An embodiment of a bit converter includes a substitution module and an output module. The substitution module substitutes a decision result representing one of "0" and "1" for input bit information based on a substitution rule for bit information for converting a bit string of a predetermined pattern into a predetermined code word. The output module outputs the decision result of the bit information substituted by the substitution module, to a decoder configured to decode the decision result into the predetermined code word.

Hereinafter, embodiments of a bit converter and a bit conversion method according to the present invention will be described with reference to the drawings. Embodiments in which the bit converter and the bit conversion method are applied to a hard disk device, for example, will be described.

First Embodiment

Figure 1:
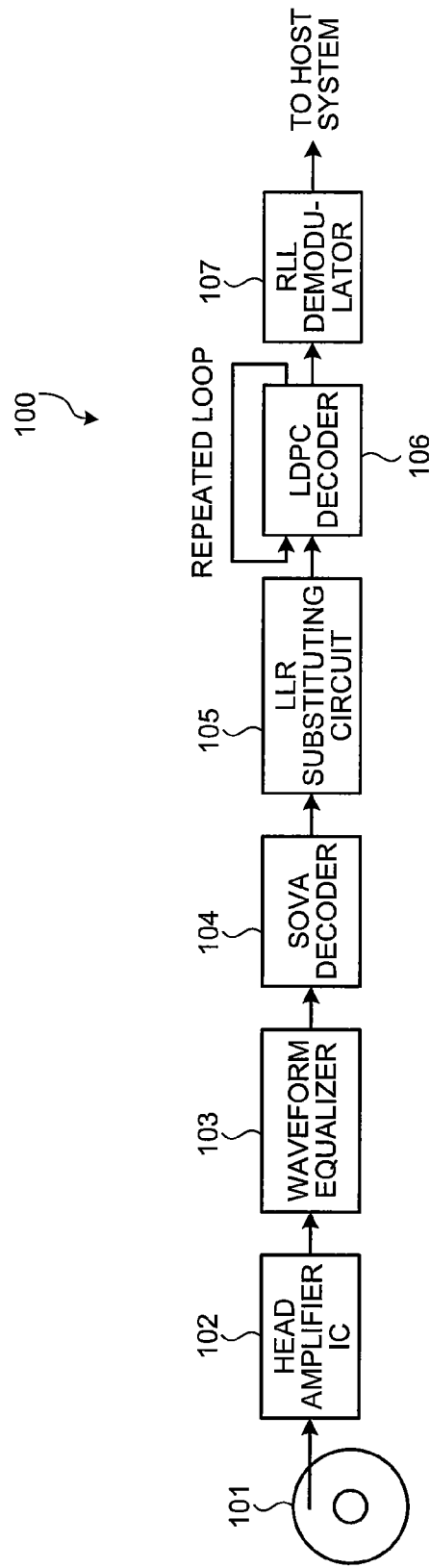
FIG. 1 is a block diagram illustrating a configuration of a read data system of a hard disk device according to a first embodiment.

FIG. 1 is a block diagram illustrating a configuration of a read data system of a hard disk device 100 according to a first embodiment. As illustrated in FIG. 1, the hard disk device 100 includes a magnetic disk 101, a head amplifier IC 102, a waveform equalizer 103, an SOVA decoder 104, an LLR substituting circuit 105, an LDPC decoder 106, and an RLL demodulator 107.

The read data system is a system that reproduces a media signal and transfers the signal to a host system such as a personal computer. A write data system that records data transmitted from the host system into media, and a servo control system related to control of an address on a disk can employ well-known configurations, so the description thereof will not be repeated. Although not illustrated, a CPU that controls the entirety of FIG. 1 is also included in the read data system.

The hard disk device 100 may be incorporated in a housing of a personal computer serving as a host system, or may be provided outside the housing.

An upper surface of the magnetic disk 101, for example, forms a recording surface on which data is magnetically recorded. A magnetic head (not illustrated) is disposed so as to correspond to the recording surface of the magnetic disk 101. The magnetic head is used to write data (record data) into the magnetic disk 101 and to read data (reproduce data) from the magnetic disk 101. Note that a lower surface of the magnetic disk 101 also forms the recording surface, and a similar head is disposed so as to correspond to the recording surface. Although the hard disk device 100 including a single magnetic disk 101 is illustrated, the hard disk device may include a plurality of magnetic disks 101 in a laminated manner.

The magnetic disk 101 is rotated at high speed by a spindle motor which is not illustrated. The magnetic head is mounted to an actuator (not illustrated) serving as a head moving mechanism.

In this embodiment, a bit string "1100", that is, a repetition of a so-called 2T pattern, for defect scanning of the magnetic disk 101, is written into the entire surface of the magnetic disk 101. Assume that a sync mark representing a start position of data is not recorded as a mode that can be recognized as another data. For example, assume that 1100xn is written as a sync mark pattern and "1100 . . . " is written from the head in a data sector. Thus, assume that the bit string "1100" is repeatedly written, regardless of a sync mark or a data sector. Further, the "1100" pattern is identical with a preamble pattern. The magnetic head can read recording bits from this reproduced waveform by synchronizing phases of clock signals. Note that this embodiment describes an example in which the above-mentioned pattern is recorded for defect scanning, but the pattern is not limited to this and any repeated pattern in accordance with a predetermined rule may be used.

In this embodiment, after completion of introducing the preamble of the magnetic disk 101 by the magnetic head, a sync mark search is entered. Assume that this sync mark pattern is set as 0011xn. Since the reproduced waveform pattern represents 1100xn, it is determined that the pattern immediately matches the sync mark pattern, and it is determined from the following "1100" that the pattern is a data part.

The head amplifier IC 102 performs A/D (analog/digital) conversion on the read reproduced signal, and then outputs the converted signal to the waveform equalizer 103. In this case, the head amplifier IC 102 amplifies the read reproduced signals.

The waveform equalizer 103 is formed of an FIR type filter that adjusts the reproduced signal into a PR characteristic to be used (equalizes waveforms). The waveform equalizer 103 selects the PR characteristic similar to that of the reproduced signal of the magnetic disk 101, thereby suppressing amplification of a noise component by the equalization. Thus, the waveform equalizer 103 equalizes a response waveform (partial response waveform signal) according to the target PR characteristic (PR class) of the reproduced signal.

The SOVA (Soft Output Viterbi Algorithm) decoder 104 is a kind of an error correcting circuit, and is an algorithm for performing soft decision based on a Viterbi algorithm on the input signal. Thus, in a reproduction system using an LDPC code as in this embodiment, binary hard decision is not performed, but soft decision is performed in which a "0" likelihood (hereinafter, a likelihood of "0") or a "1" likelihood (hereinafter, a likelihood of "1") is represented for each bit of bit information recorded on the magnetic disk 101, for repetition processing of LDPC decoding. Then, the SOVA decoder 104 outputs a likelihood path using the Viterbi algorithm, and outputs a log likelihood ratio (LLR) of a likelihood of "1" and a likelihood of "0".

Also assume that LLR=log (a likelihood that the recording bit is "0"/a likelihood that the recording bit is "1"). According to the definition, the likelihood that the recording bit is "1" is high when the LLR is negative, and the likelihood that the recording bit is "0" is high when the LLR is positive.

The LLR substituting circuit 105 corrects a log likelihood ratio (LLR) representing a soft decision result received from the SOVA decoder 104, to a log likelihood ratio representing a linear code that can be decoded by the LDPC decoder 106.

The LDPC decoder 106 executes error detection using the LLR corrected by the LLR substituting circuit 105, and outputs the decoding result based on the likelihood path to the RLL demodulator 107. In this case, the LDPC decoder 106 iteratively performs decoding.

The RLL demodulator 107 performs reverse processing (demodulation) of RLL modulation, and obtains recorded data. After that, the obtained data is output to the host system via a bus.

Figure 2:
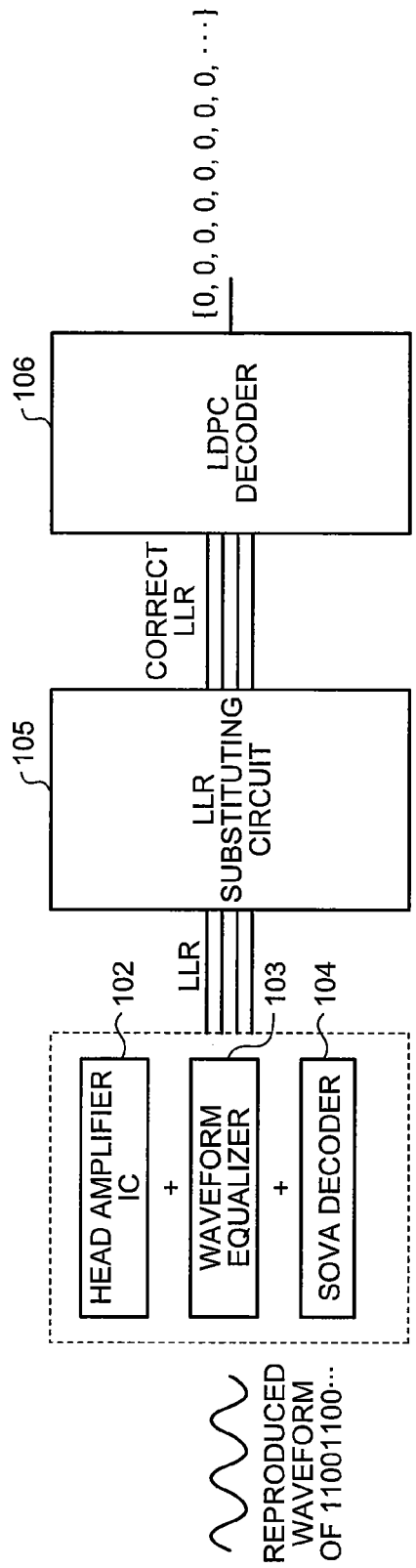
FIG. 2 is a diagram illustrating a configuration related to an LLR substituting circuit according to the first embodiment.

FIG. 2 is a diagram illustrating a configuration related to the LLR substituting circuit 105 according to this embodiment. As illustrated in FIG. 2, the LLR substituting circuit 105 is disposed at a subsequent stage of the head amplifier IC 102, the waveform equalizer 103, and the SOVA decoder 104, and is disposed at a former stage of the LDPC decoder 106.

With the configuration illustrated in FIG. 2, a reproduced waveform "11001100 . . . " read from the magnetic disk 101 is output as all zeros {0,0,0, 0,0,0,0,0, . . . }. In a pattern in which "11" and "00" are alternately written as in "11001100 . . . ", the pattern cannot be converted into a correct code word by the LDPC decoder 106.

The LLR substituting circuit 105 performs correction on the LLR related to the input bit information so as to be converted into a correct code word by the LDPC decoder 106. LDPC of this LDPC decoder 106 is a linear code. On the other hand, in the linear code, all zeros indicate a correct code word (hereinafter, this code word representing all zeros is called "all-zero code word"). The LLR substituting circuit 105 according to this embodiment corrects the LLR related to the input bit information so as to be decoded as the all-zero code word by the LDPC decoder 106.

Incidentally, the linear code used in this embodiment is characterized in that encoding and decoding are more effective than other codes (for example, syndrome decoding). The linear code is applied to the case of transferring a symbol string (bit string) to a transmission line. Accordingly, even if errors occur during transfer, a part of the errors can be detected and corrected on the receiving side (LDPC decoder 106 in this embodiment). The "code" of the linear code refers to a block of symbols, and is encoded using more symbols (bits) than those of the symbol string to be originally transmitted.

Figure 3:
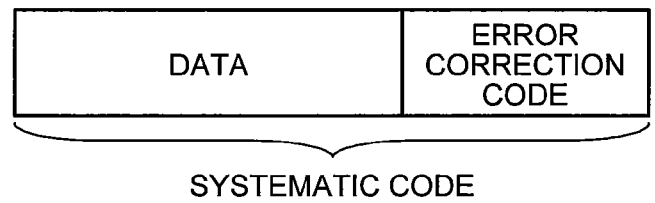
FIG. 3 is a diagram illustrating an example of a code word used in the first embodiment.

FIG. 3 is a diagram illustrating an example of a code word used in this embodiment. As illustrated in FIG. 3, in this embodiment, a systematic code is used as a code word, and a bit string obtained by adding a code capable of correcting an error to arbitrary data (bit string) is used.

A linear code having a length "n" of arbitrary data (bit string) illustrated in FIG. 3 transfers a block including "n" number of symbols.

Figure 4:
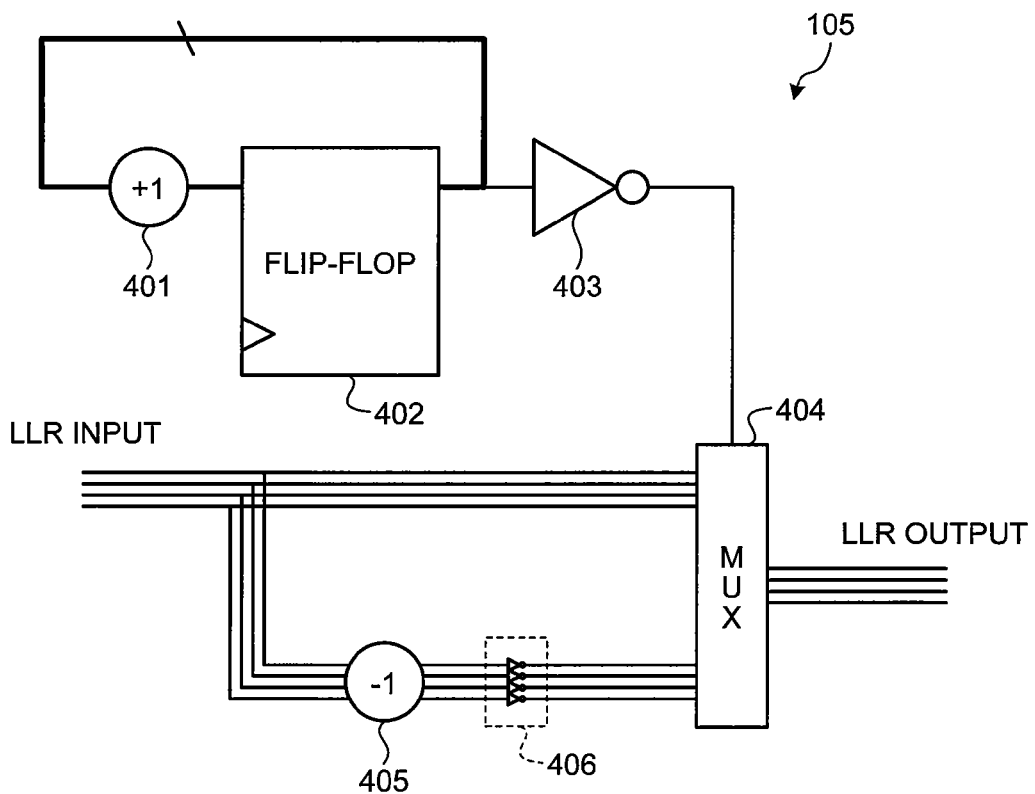
FIG. 4 is a diagram illustrating a configuration example of the LLR substituting circuit according to the first embodiment.

FIG. 4 is a diagram illustrating an exemplary configuration of the LLR substituting circuit 105 according to this embodiment. As illustrated in FIG. 4, the LLR substituting circuit 105 includes a "1" addition unit 401, a flip-flop 402, and a NOT circuit 403, a selector circuit (MUX) 404, a "1" subtraction unit 405, and an inverter 406.

In the example illustrated in FIG. 4, the input LLR is formed of a 4-bit string. Four signal lines of an LLR input are respectively allocated to bits. Assume in this embodiment that the LLR is represented by a 2's complement. Assuming that the LLR is represented by "log (a likelihood that the recording bit is "0"/a likelihood that the recording bit is "1")", the LLR is a positive number when a soft decision value has a high likelihood of "0", and the LLR is a negative number when the soft decision value has a high likelihood of "1".

Incidentally, as described above, the 2T pattern is written into the magnetic disk 101. Accordingly, when no error occurs during transfer from the magnetic disk 101, the SOVA decoder 104 outputs, to the LLR substituting circuit 105, a repetition of a soft decision value having a high likelihood of "1", a soft decision value having a high likelihood of "1", a soft decision value having a high likelihood of "0", and a soft decision value having a high likelihood of "0", as the LLR. That is, a pattern "positive, positive, negative, negative" is repeatedly output as the LLR value.

The LLR substituting circuit 105 according to this embodiment outputs a set of soft decision values related to the bit information received from the SOVA decoder 104 as a pattern "inverted, inverted, non-inverted, non-inverted" in order from the head, as an inverted value or a non-inverted value. Through this operation, if there is no error in the input pattern, that is, if the LLR code represents a repetition of "positive, positive, negative, negative", the soft decision value set of the input bit information is corrected so that the output LLR value is output as all zeros, that is, a repetition of the LLR code representing "negative, negative, negative, negative". If the input LLR code falls out of the pattern "positive, positive, negative, negative", that is, if an error is present, also the LLR value to be output falls out of the pattern "negative, negative, negative, negative", that is, the error is left and output.

Through this operation, the LDPC decoder 106 decodes the LLR output by the LLR substituting circuit 105 if no error occurs in the input pattern, and the all-zero code word with no error is output as the decoding result. Even if some errors that can be corrected by the LDPC decoder 106 occurs in the input pattern, these errors are corrected in the decoding by the LDPC decoder 106, and the all-zero code word is output as the decoding result.

Next, a specific operation of the LLR substituting circuit 105 illustrated in FIG. 4 will be described. First, the flip-flop 402 includes a 2-bit counter. The "1" addition unit 401 is synchronized with the input of the LLR from the head of the data sequence, and adds "1" each time to the counter of the flip-flop 402. This allows the counter to operate in such a manner that 00→01→10→11.

On the other hand, the "1" subtraction unit 405 subtracts "1" from the input LLR. The inverter 406 inverts the input 4-bit string. That is, the "1" subtraction unit 405 and the inverter 406 perform inversion processing on positive numbers when the 4-bit string of the input 2's complement is a negative number and on negative numbers when the 4-bit string is a positive number.

The high-order bits of the 2-bit counter of the flip-flop 402 have a repeated pattern of 0, 0, 1, 1. Accordingly, when the high-order one bit is "0", the LLR having a bit of "1" recorded on the magnetic disk 101 is input to the LLR substituting circuit 105. On the other hand, when the high-order one bit is "1", the LLR having a bit of "0" recorded on the magnetic disk 101 is input to the LLR substituting circuit 105.

After the NOT circuit 403 inverts the high-order one bit of the counter of the flip-flop 402, the selector circuit 404 selects one of the uncorrected LLR and the LLR inverted by the "1" subtraction unit 405 and the inverter 406, based on the one bit received from the NOT circuit 403, to output the selected LLR. The selector circuit 404 according to this embodiment outputs the inverted LLR when the high-order bit of the counter of the flip-flop 402 is "0", and directly outputs the LLR when the high-order bit is "1".

Thus, when only such errors that can be corrected are included, the LDPC decoder 106 receives the corrected LLR and outputs the all-zero code word as a decoding result.

In this embodiment, the LLR substituting circuit 105 corrects the LLR so as to be decoded to the all-zero code word, thereby making it possible to reduce the load on the processing during decoding. Note that the all-zero code word is effective because the load on the processing is light, but the code word of this embodiment is not limited to the all-zero code word. Code words other than the all-zero code word may be used as long as the code word can be decoded by the LDPC decoder 106.

In this embodiment, the case where the pattern of "1100" is repeated as the pattern written into the magnetic disk 101 has been described. However, the pattern is not limited to this, and any other patterns may be used as long as the pattern is based on a predetermined rule.

Note that in this embodiment the case where the bit string representing the LLR (log likelihood ratio) is a 2's complement has been described. However, the bit string is not limited to a 2's complement, but a 1's complement, for example, may be used. According to this change, the configuration of the LLR substituting circuit 105 may be appropriately changed.

Modification of First Embodiment

In the first embodiment, the example in which the SOVA decoder 104 performs soft decision in accordance with the LDPC decoding is explained. However, the present invention is not limited to the case of performing soft decision, but may be applied to the case of performing hard decision. Accordingly, in this modification, an example in which a Viterbi decoder that performs hard decision is used instead of the SOVA decoder 104 will be described.

In this case, a decoding circuit that performs decoding into a code word based on a hard decision result obtained by the Viterbi decoder is provided instead of the LDPC decoder 106.

Further, a substituting circuit is provided between the Viterbi decoder and the decoding circuit that performs conversion into a code word. This substituting circuit substitutes a hard decision result obtained by Viterbi decoding based on a substitution rule for converting a predetermined pattern (for example, 2T pattern) written into the magnetic disk 101 into a code word that can be decoded in the decoding circuit. Note that a processing procedure during substitution is basically similar to the processing of the first embodiment except that the substitution target is changed from the soft decision to the hard decision, so the description thereof will not be repeated.

Second Modification of First Embodiment

Figure 5:
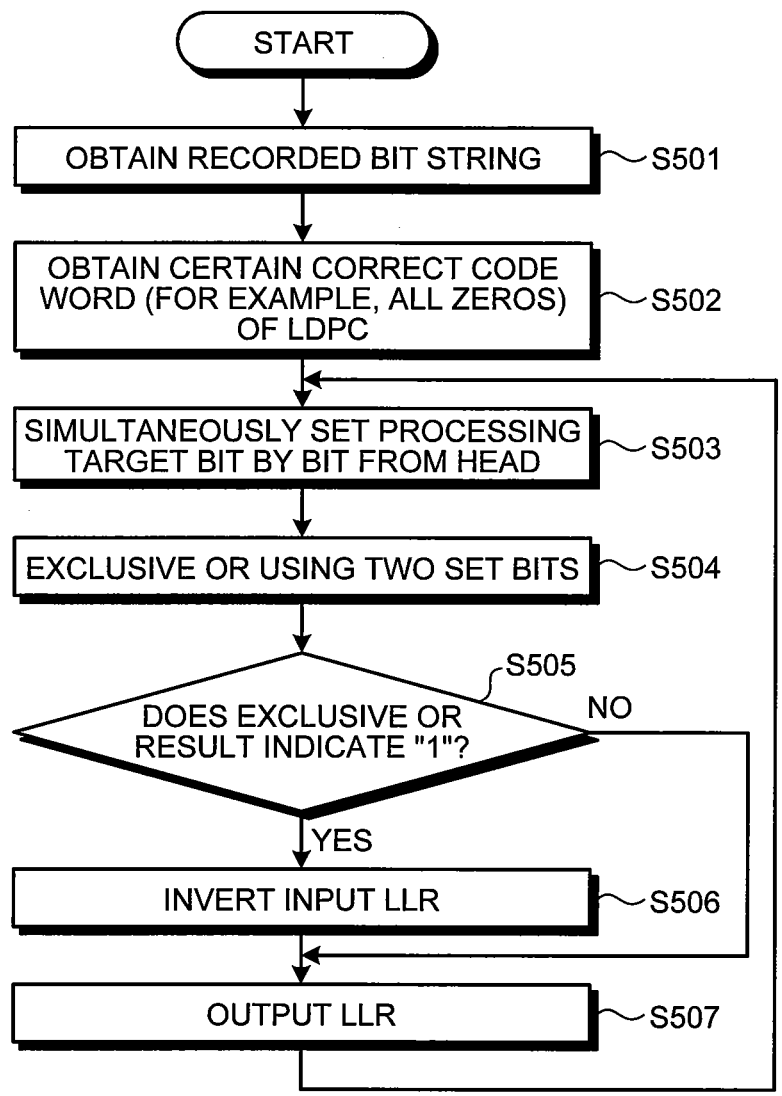
FIG. 5 is a flowchart illustrating a processing procedure in a read data system in a CPU incorporated in a hard disk device according to a second modification of the first embodiment.

In the first embodiment, the example in which processing is performed with a hardware configuration has been described. However, the processing is not limited to hardware processing, but the processing may be performed by a CPU into which a bit substitution program is read. Accordingly, in the hard disk device 100 according to the first modification of the first embodiment, an example of performing the processing by the CPU into which the bit substitution program is read. FIG. 5 is a flowchart illustrating the processing performed by the CPU incorporated in the hard disk device 100 according to a second modification of the first embodiment.

First, the CPU obtains bit information recorded on the magnetic disk 101 (step S501). Next, the CPU obtains a certain correct code word (for example, an all-zero code word) of the LDPC decoder 106 (step S502).

Then, the CPU simultaneously sets the obtained bit information and code word as a processing target bit by bit from the head (step S503). After that, the CPU performs an exclusive OR operation on two bits (one bit of a bit string and one bit of a code word) set as the processing target (step S504).

Then, the CPU determines whether the result of the exclusive OR indicates "1" (step S505). When it is determined that the result does not indicate "1" (step S505: No), the process proceeds to step S507.

On the other hand, when the CPU determines that the result indicates "1" (step S505: Yes), inversion processing is performed on the LLR received from the SOVA decoder 104 (step S506).

Then, the CPU outputs the LLR to the LDPC decoder 106 (step S507). After that, the CPU performs processing from step S503 on the subsequent bit of the bit information.

In this modification, the same results as those of the first embodiment can be obtained through the above-mentioned processing.

Second Embodiment

In the first embodiment, the example in which the LLR (log likelihood ratio) is inverted for each bit has been described. However, the present invention is not limited to the processing performed for each bit, but a symbol formed of a plurality of bits may be processed. Accordingly, in a second embodiment, a case of performing processing in units of symbol will be described.

Figure 6:
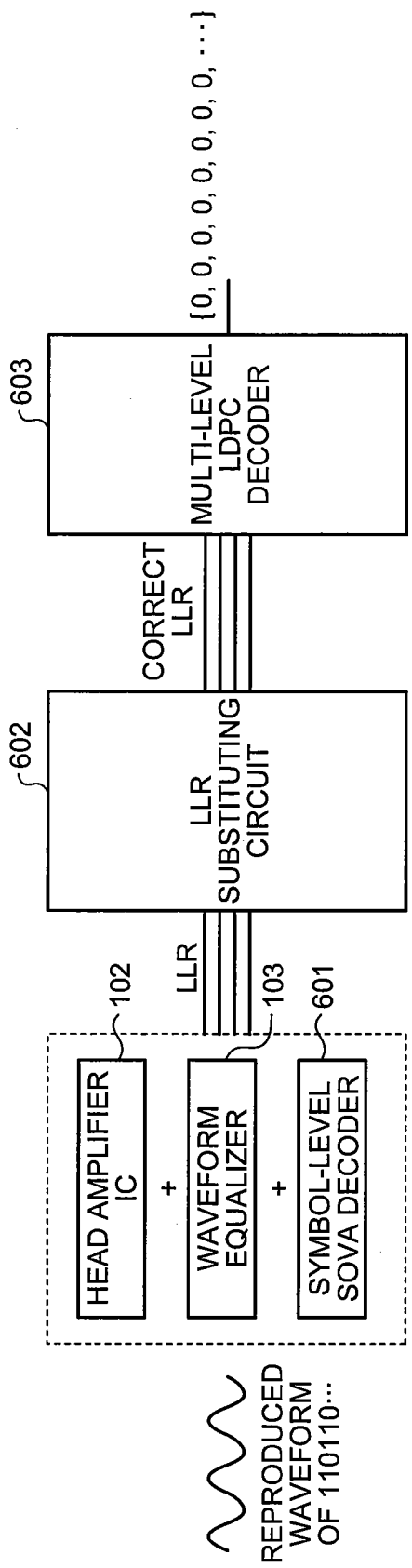
FIG. 6 is a diagram illustrating a configuration related to an LLR substituting circuit according to a second embodiment.

FIG. 6 is a diagram illustrating a configuration related to an LLR substituting circuit 602 according to this embodiment. As illustrated in FIG. 6, the LLR substituting circuit 602 is disposed at a subsequent stage of the head amplifier IC 102, the waveform equalizer 103, and a symbol-level SOVA decoder 601, and is disposed at a former stage of the multi-level LDPC decoder 603.

This embodiment assumes a case of LDPC decoding configured by a member of a GF (Galois field)(8). In this case, processing is performed using a 3-bit string as a symbol.

The symbol-level SOVA decoder 601 differs from the SOVA decoder 104 of the first embodiment in that the processing is performed in units of symbol. The symbol-level SOVA decoder 601 calculates a likelihood on an input symbol based on a Viterbi algorithm.

The multi-level LDPC decoder 603 performs decoding in units of symbol, and outputs the decoding result to the RLL demodulator 107.

In the case of LDPC decoding configured by the member of the GF(8), for example, as in this embodiment, the SOVA decoder 104 maps each 3-bit pattern to be recorded on the magnetic disk 101 on the member of the GF(8).

In this case, assume that the member on the GF(8) is represented by $\{0, \alpha 0, \alpha 1, \alpha 2, \alpha 3, \alpha 4, \alpha 5, \alpha 6\}$, and the label thereof is represented by $\{000, 001, 010, 100, 011, 110, 111, 101\}$.

Incidentally, the SOVA decoder 104 according to the first embodiment calculates a log likelihood ratio (LLR) of a likelihood of "1" and a likelihood of "0". On the other hand, the SOVA decoder 601 according to this embodiment calculates, for each symbol, a likelihood of "000", a likelihood of "001", a likelihood of "010", a likelihood of "100", a likelihood of "011", a likelihood of "110", a likelihood of "111", and a likelihood of "101".

When the bit string actually written into the magnetic disk 101 is a repetition of "110" ($=\alpha 4$), the LLR substituting circuit 602 may perform processing of substituting a likelihood of the bit string "110" with a likelihood representing the possibility of the all-zero sequence "000" which is a code word that can be decoded.

Figure 7:
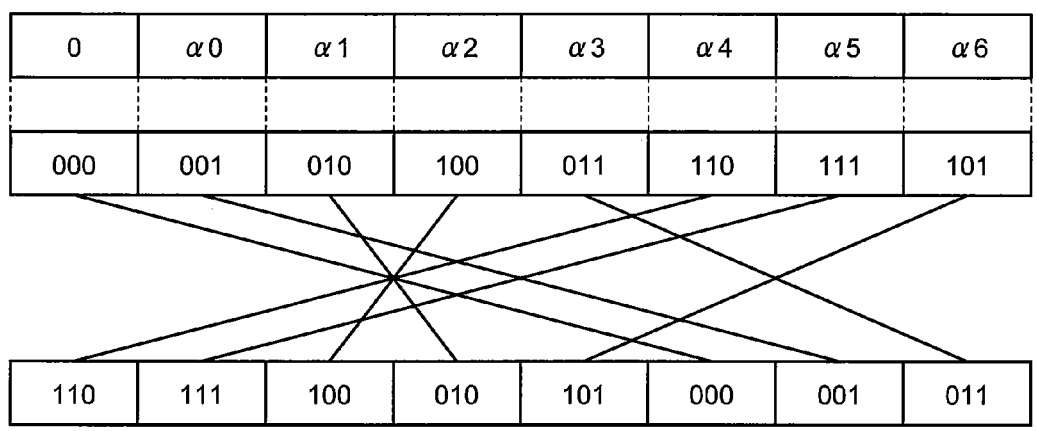
FIG. 7 is a diagram illustrating an example in which first two bits of a 3-bit string are inverted for each label in the LLR substituting circuit according to the second embodiment.

Execution of the processing of substituting the bit string "110" with the bit string "000" means inversion of first two bits of the three bits. FIG. 7 is a diagram illustrating an example in which first two bits of the 3-bit string are inverted for each label in the LLR substituting circuit according to this embodiment.

As illustrated in FIG. 7, when first two bits of the three bits are inverted for each label, $\{000, 001, 010, 100, 011, 110, 111, 101\}$ is substituted with $\{110, 111, 100, 010, 101, 000, 001, 011\}$.

Assume that the LLR substituting circuit 602 according to this embodiment performs substitution of a likelihood as illustrated in FIG. 7.

Specifically, the LLR substituting circuit 602 according to this embodiment may substitute a likelihood of "0" for a likelihood of $\alpha 4$, substitute a likelihood of $\alpha 0$ for a likelihood of $\alpha 5$, substitute a likelihood of $\alpha 1$ for a likelihood of $\alpha 6$, and substitute a likelihood of $\alpha 2$ for a likelihood of $\alpha 3$, for example.

Thus, the LLR substituting circuit 602 substitutes a likelihood of the pattern sequence "000" for the likelihood calculated as the pattern sequence "110" of $\alpha 4$ written into the magnetic disk 101, and outputs the likelihood to the multi-level LDPC decoder 603.

In the second embodiment, the example in which the likelihood of the all-zero sequence is converted will be described. However, the sequence is not limited to the all-zero sequence, as long as the sequence is a correct sequence as the LDPC code word. In this case, "a likelihood of recorded bit sequence" and "a likelihood of bit sequence for a correct code word" at the position of the bit string may be replaced.

Modification of Second Embodiment

In the second embodiment, the case of the pattern "110" written into the magnetic disk 101 has been described. However, the pattern written into the magnetic disk 101 is not limited to "110", but the number of bits of the pattern written into the magnetic disk 101 may be different from the number of bits of the symbol. Accordingly, in the modification of the second embodiment, a case where the pattern written into the magnetic disk 101 represents "1100" will be described.

This modification assumes a case of LDPC decoding configured by a member of a GF (Galois field)(8). To convert a repetition of "1100" into an all-zero sequence, a conversion table may be prepared so that bit strings "110", "011", "001", and "100", which are obtained by partitioning "110011001100" by three bits, can be substituted by the all-zero sequence.

The table for converting "110" into the all-zero sequence is similar to the table illustrated in FIG. 7 in the second embodiment. Also for "011", "001", and "100", a conversion table for substitution of likelihoods is prepared. The LLR substituting circuit 602 according to this modification uses different conversion tables for substitution of likelihoods based on which position of "110", "011", "001", and "100" the bit string read from the magnetic disk 101 corresponds to. Note that the substitution method is similar to that of the second embodiment, so the description thereof will not be repeated.

Thus, even when the number of bits of the pattern written into the magnetic disk 101 is different from the number of bits forming the symbol, the multi-level LDPC decoder 603 can perform conversion into a likelihood that can be decoded into a code word.

The hard disk device according to the embodiments and modifications described above is capable of performing correct LDPC decoding of an arbitrary recording pattern. In other words, in the hard disk device according to the embodiments and modifications described above, a specific pattern (for example, 2T pattern necessary for defect scanning) to be written during heat run can be directly subjected to LDPC decoding. This enables error rate measurement even in the state where a defect scan pattern is written into the magnetic disk 101 of the hard disk device. Furthermore, defect scanning and error rate measurement can be simultaneously executed.

That is, in the hard disk device according to the embodiments and modifications described above, the need for the processing step of rewriting the pattern for defect scanning, which is written into the magnetic disk 101, with the pattern that can be subjected to LDPC decoding is eliminated. This leads to a reduction in heat run time.

Additionally, in the hard disk device according to the embodiments and modifications described above, the pattern written into the magnetic disk 101 can be decoded, even when the pattern is not a bit string that can be decoded by the LDPC decoder 106. This enables adjustment of a signal intensity based on the pattern written into the magnetic disk 101. That is, a signal quality (S intensity of S/N) can be controlled by directly decreasing power of a reproduced signal, without intentionally increasing noise and without deteriorating the decoding ability of the LDPC noise as a unit for accelerating the error rate measurement.

In the hard disk device according to the embodiments and modifications described above, the example in which a binary LDPC or a multi-level LDPC is applied has been described. In any case, the present invention can be achieved by adding an extremely small circuit to a typical configuration.

Note that in the embodiments described above, the case of reproducing the bit string written into the magnetic disk 101 of the hard disk device has been described. However, the target of the error rate measurement is not limited to the magnetic disk 101 of the hard disk device, but may be applied to a magneto-optical disk or other recording media.

Furthermore, the target of error rate measurement is not limited to recording media. For example, the configurations in the above embodiments and modifications may be applied to a device that transmits and receives a predetermined bit string and checks the quality of a communication cable or the like.

In this manner, even when a communication cable or the like is used as an error rate measurement target, when the device that performs measurement includes the above-mentioned configuration, the error rate measurement can be performed without limiting the pattern of the bit string to be transmitted and received via a communication cable. As a result, the adjustment of the signal intensity of the bit string using a bit string pattern can be achieved. Moreover, the error rate measurement can be performed simultaneously with another test, thereby achieving a reduction in processing time. Consequently, in the hard disk according to the embodiments and modifications described above and the measurement device including the above-mentioned configuration, a suitable inspection can be executed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A bit converter between an upstream decoder and a downstream decoder, comprising:
    a substitution module configured to substitute a decision result from the upstream decoder representing a bit string of a predetermined pattern based on a substitution rule for converting the bit string of the predetermined pattern into a predetermined correct code word, the predetermined pattern being used for inspection and having a pattern that cannot be converted into the predetermined correct code word by the downstream decoder; and
    an output module configured to output the decision result from the upstream decoder as substituted by the substitution module, to the downstream decoder.

2. The bit converter according to claim 1, wherein the decision result indicates a log likelihood ratio of "0" and "1" for each bit of the bit string represented thereby.

3. The bit converter according to claim 2, wherein the substitution module is configured to substitute the decision result by selectively inverting each bit of the bit string.

4. A bit converter between an upstream decoder and a downstream decoder, comprising:
    a substitution module configured to substitute a likelihood of each member of a Galois field based on a substitution rule for converting a symbol string formed of a plurality of bits of a predetermined pattern into a predetermined code word, the predetermined pattern being used for inspection and having a pattern that cannot be converted into the predetermined correct code word by the downstream decoder; and
    an output module configured to output the likelihood of each member of the Galois field as substituted by the substitution module, to the downstream decoder.

5. The bit converter according to claim 1, wherein the predetermined correct code word is an all-zero code word.

6. A bit conversion method to be executed in a bit converter that is between an upstream decoder and a downstream decoder, the bit conversion method comprising:
    substituting a decision result from the upstream decoder representing a bit string of a predetermined pattern based on a substitution rule for converting the bit string of the predetermined pattern into a predetermined correct code word, the predetermined pattern being used for inspection and having a pattern that cannot be converted into the predetermined correct code word by the downstream decoder; and
    outputting the decision result from the upstream decoder as substituted according to said substituting, to the downstream decoder.

7. The bit conversion method according to claim 6, wherein the decision result indicates a log likelihood ratio of "0" and "1" for each bit of the bit string represented thereby.

8. The bit conversion method according to claim 7, wherein the decision result is substituted by selectively inverting each bit of the bit string.

9. The bit conversion method according to claim 6, wherein the predetermined correct code word is an all-zero code word.

10. The bit converter according to claim 4, wherein the predetermined correct code word is an all-zero code word.

* * * * *